United States Patent
Kim et al.

(10) Patent No.: US 10,009,030 B2
(45) Date of Patent: Jun. 26, 2018

(54) INTEGRATED CIRCUIT AND CABLE ASSEMBLY INCLUDING THE SAME

(71) Applicant: SAMSUNG ELECTRONICS CO., LTD., Suwon-si (KR)

(72) Inventors: Je Kook Kim, Yongin-si (KR); Jin Hyuck Yu, Hwaseong-si (KR); You So Cheon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days. days.

(21) Appl. No.: 15/856,873

(22) Filed: Dec. 28, 2017

(65) Prior Publication Data

US 2018/0123594 A1 May 3, 2018

Related U.S. Application Data

(63) Continuation of application No. 15/078,116, filed on Mar. 23, 2016, now Pat. No. 9,871,524.

(30) Foreign Application Priority Data

Apr. 17, 2015 (KR) .................... 10-2015-0054721
Dec. 1, 2015 (KR) .................... 10-2015-0169878

(51) Int. Cl.
*H03K 19/0185* (2006.01)
*H03K 19/003* (2006.01)

(52) U.S. Cl.
CPC ... *H03K 19/018592* (2013.01); *H03K 19/003* (2013.01); *H03K 19/018507* (2013.01)

(58) Field of Classification Search
CPC ......... H03K 19/018592; H03K 19/003; H03K 19/00315; H03K 19/00346; H03K 19/00361
See application file for complete search history.

(56) References Cited

U.S. PATENT DOCUMENTS

| | | | | |
|---|---|---|---|---|
| 5,627,458 | A | * | 5/1997 | Nevin ..................... H02M 3/07 323/267 |
| 6,256,682 | B1 | * | 7/2001 | Gudan ..................... G06F 1/26 710/14 |
| 6,351,109 | B1 | | 2/2002 | Yoshida |
| 6,973,516 | B1 | | 12/2005 | Athanas et al. |
| 7,233,191 | B2 | | 6/2007 | Wang et al. |

(Continued)

OTHER PUBLICATIONS

Bill Cornelius et al., "Universal Serial Bus Power Delivery Specification", USB Power Delivery Specification Revision 2.0, Version 1.0, Aug. 2014, (pp. 1-534).

(Continued)

*Primary Examiner* — Thomas J Hiltunen
(74) *Attorney, Agent, or Firm* — Sughrue Mion, PLLC

(57) ABSTRACT

An integrated circuit embedded in a plug of a universal serial bus (USB) 3.1 type-C cable assembly is disclosed. The integrated circuit includes a first pin connected to an operation transmission line through which an operation voltage is transmitted, a second pin connected to a configuration channel (CC) line, a first resistor connected to the first pin, a ground line, and a switching circuit configured to connect the first resistor and the ground line using a channel voltage supplied to the second pin when the operation voltage is not applied, and disconnect the first resistor from the ground line based on the operation voltage.

20 Claims, 9 Drawing Sheets

(56) References Cited

U.S. PATENT DOCUMENTS

| | | | |
|---|---|---|---|
| 7,763,812 | B2 | 7/2010 | Fukuda |
| 7,772,786 | B2 | 8/2010 | Hosoda et al. |
| 8,028,178 | B2 | 9/2011 | Gk et al. |
| 8,174,802 | B2 | 5/2012 | Abe |
| 8,237,414 | B1 | 8/2012 | Li |
| 8,330,294 | B2 | 12/2012 | Nishigata |
| 8,575,917 | B2 | 11/2013 | Sims et al. |
| 8,624,663 | B2 | 1/2014 | Gagne et al. |
| 8,806,236 | B2 | 8/2014 | Fu |
| 8,830,073 | B2 | 9/2014 | Sims et al. |
| 9,400,546 | B1 | 7/2016 | Agarwal |
| 9,558,144 | B2 | 1/2017 | Nge |
| 9,871,524 | B2 * | 1/2018 | Kim ............... H03K 19/018592 |
| 2005/0228934 | A1 | 10/2005 | Tsutsui |
| 2006/0132417 | A1 | 6/2006 | Shigenobu et al. |
| 2007/0285861 | A1 * | 12/2007 | Kim ................. H03K 19/00361 361/91.3 |
| 2011/0068626 | A1 | 3/2011 | Terlizzi et al. |
| 2013/0018624 | A1 | 1/2013 | Bhatnagar |
| 2013/0083577 | A1 | 4/2013 | Urienza |
| 2014/0193003 | A1 | 7/2014 | Gagne |
| 2015/0229119 | A1 | 8/2015 | Tao |
| 2015/0268688 | A1 | 9/2015 | Leinonen |
| 2015/0277527 | A1 | 10/2015 | Liu |
| 2015/0346790 | A1 | 12/2015 | Talmola |
| 2015/0357928 | A1 | 12/2015 | Itakura |
| 2016/0188514 | A1 | 6/2016 | Forghani-Zadeh |
| 2016/0308452 | A1 | 10/2016 | Motoki |
| 2016/0342492 | A1 | 11/2016 | Chen |
| 2017/0093154 | A1 | 3/2017 | Geng |
| 2017/0220090 | A1 * | 8/2017 | Kim ........................ G06F 1/266 |
| 2018/0024899 | A1 * | 1/2018 | Degura ................. G06F 11/221 |

OTHER PUBLICATIONS

Glen Chandler et al., "Universal Serial Bus Type-C Cable and Connector Specification", USB Type-C Cable and Connector Specification, USB 3.0 Promoter Group, Revision 1.0, Aug. 11, 2014, (pp. 1-171).

Walt Kester et al., "Section 4 Switched Capacitor Voltage Converters", Switched Capacitor Voltage Converters, (21 pages total).

* cited by examiner

FIG. 3A

| A1 | A2 | A3 | A4 | A5 | A6 | A7 | A8 | A9 | A10 | A11 | A12 |
|----|----|----|----|----|----|----|----|----|----|----|----|
| GND | TX1+ | TX1- | VBUS | CC1 | D+ | D- | RFU1 | VBUS | RX2- | RX2+ | GND |
| GND | RX1+ | RX1- | VBUS | RFU2 | D- | D+ | CC2 | VBUS | TX2- | TX2+ | GND |
| B12 | B11 | B10 | B9 | B8 | B7 | B6 | B5 | B4 | B3 | B2 | B1 |

FIG. 3B

| A12 | A11 | A10 | A9 | A8 | A7 | A6 | A5 | A4 | A3 | A2 | A1 |
|----|----|----|----|----|----|----|----|----|----|----|----|
| GND | RX2+ | RX2- | VBUS | RFU1 | D- | D+ | CC | VBUS | TX1- | TX1+ | GND |
| GND | TX2+ | TX2- | VBUS | VCONN |  |  | RFU2 | VBUS | RX1- | RX1+ | GND |
| B1 | B2 | B3 | B4 | B5 | B6 | B7 | B8 | B9 | B10 | B11 | B12 |

INTEGRATED CIRCUIT AND CABLE ASSEMBLY INCLUDING THE SAME

CROSS-REFERENCE TO RELATED APPLICATIONS

This application is a continuation of U.S. application Ser. No. 15/078,116 filed Mar. 23, 2016, which claims priority from Korean Patent Application Nos. 10-2015-0054721 filed on Apr. 17, 2015, and 10-2015-0169878, filed Dec. 1, 2015, the disclosure of which is incorporated by reference herein in its entirety.

BACKGROUND

1. Field

Embodiments of the present inventive concept relate to a universal serial bus (USB) interface and more particularly to an integrated circuit which can be embedded in a plug of a USB 3.1 type-C interface to reduce power consumption of the integrated circuit, and a cable assembly including the same.

2. Description of the Related Art

A universal serial bus (USB) is a standard (for example, USB 2.0, USB 3.0, USB 3.1 standard) for connecting a USB host such as a personal computer (PC) and an external device.

The USB host tends to be extended to portable devices (mobile devices such as a touch pad, a tablet PC, and the like) as well as PCs, and users of the USB devices request faster speed and lower power consumption.

A USB 3.1 has an advantage of being two times faster than a conventional USB 3.0 in transmission speed, data transmission speed per second of the USB 3.0 is up to 5 Gbps (625 MB per second), but the USB 3.1 may be up to 10 Gbps (1.25 GB per second). The USB 3.1 provides a mount and a connector in three types of type-A, type-B, and type-C. The type-A and the type-B are standards emerging along with a USB 3.0.

A type-A may be, as the most widely used USB type, compatible with all of USB 1.1 and 2.0, and may be employed in a PC, a laptop computer, a monitor, a television (TV), and the like. A type-B has been adopted in an external hard disk drive or smart phones as a standard emerging so as to improve speed while maintaining compatibility with a USB 2.0 micro B type. A type-C features no distinction between front and back of the USB and may be connected to a device by arbitrarily changing a direction as a newly emerging standard.

SUMMARY

An example embodiment of the present inventive concepts is directed to an integrated circuit. The integrated circuit includes a first pin which can be connected to an operation voltage transmission line through which an operation voltage is transmitted, a second pin which can be connected to a configuration channel (CC) line, a first resistor connected to the first pin, a ground line, and a switching circuit which connects the first resistor and the ground line using a channel voltage supplied to the second pin when the operation voltage is not applied, and disconnects the first resistor from the ground line based on the operation voltage.

The switching circuit may include a first switch connected between the first resistor and the ground line, a switch signal generator which is connected between a control terminal of the first switch and the second pin, and generates switch signals for controlling an operation of the first switch, and a control signal generator which generates control signals for controlling an operation of the switch signal generator.

The control signal generator may generate a first control signal in response to the channel voltage supplied to the second pin, the switch signal generator may generate a first switch signal which turns on the first switch in response to the first control signal, and the first resistor may be connected to the ground line in response to the first switch signal.

After the first resistor and the ground line are connected to each other, the control signal generator may generate a second control signal based on the operation voltage supplied to the first pin, the switch signal generator may generate a second switch signal which turns off the first switch in response to the second control signal, and the first resistor may be disconnected from the ground line in response to the second switch signal. The second control signal may be generated in response to a power stabilization signal which indicates the operation voltage for the integrated circuit is stabilized.

The first switch may be an NMOS transistor, the integrated circuit may further include a negative charge pump which supplies a negative voltage to a gate of the NMOS transistor in response to the second control signal.

The integrated circuit may further include a third pin which can be connected to the operation voltage transmission line, and a second resistor which is connected to the third pin, the switching circuit may further include a second switch which is connected between the second resistor and the ground line, and the switch signal generator may be connected between a control terminal of the second switch and the third pin.

The control signal generator may generate a third control signal in response to the channel voltage supplied to the second pin, the switch signal generator may generate a third switch signal which turns on the second switch in response to the third control signal, and the second resistor may be connected to the ground line in response to the third switch signal.

The control signal generator may generate a fourth control signal based on the operation voltage supplied to the third pin, the switch signal generator may generate a fourth switch signal which turns off the second switch in response to the fourth control signal, and the second resistor may be disconnected from the ground line in response to the fourth switch signal.

An example embodiment of the present inventive concepts is directed to a cable assembly, including a cable and a plug which is connected to the cable and includes an integrated circuit, in which the integrated circuit includes a first pin which can be connected to an operation voltage transmission line through which an operation voltage is transmitted, a second pin which can be connected to a configuration channel (CC) line, a first resistor connected to the first pin, a ground line, and a switching circuit which connects the first resistor and the ground line using a channel voltage supplied to the second pin when the operation voltage is not applied, and disconnects the first resistor from the ground line based on the operation voltage.

The switching circuit may include a first switch connected between the first resistor and the ground line, a switch signal generator which is connected between a control terminal of the first switch and the second pin and generates switch signals for controlling an operation of the first switch, and a control signal generator which generates control signals for controlling an operation of the switch signal generator.

The control signal generator may generate a first control signal in response to the channel voltage supplied to the second pin, the switch signal generator generates a first switch signal which turns on the first switch in response to the first control signal, and the first resistor and the ground line may be connected to each other in response to the first switch signal.

After the first resistor and the ground line are connected to each other, the control signal generator generates a second control signal based on the operation voltage supplied to the first pin, the switch signal generator generates a second switch signal which turns off the first switch in response to the second control signal, and first resistor may be disconnected from the ground line in response to the second switch signal. The second control signal may be generated in response to a power stabilization signal which indicates the operation voltage for the integrated circuit is stabilized.

The integrated circuit may further include a third pin which can be connected to the operation voltage transmission line, and a second resistor connected to the third pin, the switching circuit may further include a second switch connected between the second resistor and the ground line, and the switch signal generator may be connected between a control terminal of the second switch and the third pin.

An example embodiment of the present inventive concepts is directed to a cable assembly, including a cable and a plug connected to the cable and includes an integrated circuit, wherein the integrated circuit includes a first pin connected to an operation voltage transmission line through which an operation voltage is transmitted, a second pin connected to a configuration channel (CC) line, a first resistor connected to the first pin, a ground line, and a switching circuit configured to control connection between the first resistor and the ground line in response to at least one of a first voltage supplied through the first pin and a second voltage supplied through the second pin.

The switching circuit may connect the first resistor and the ground in response to the second voltage, the switching circuit may disconnect the first resistor from the ground in response to the first voltage.

BRIEF DESCRIPTION OF THE DRAWINGS

The above and other features of the present inventive concept will become more apparent by describing in detail example embodiments thereof with reference to the accompanying drawings, in which:

FIG. 3A illustrates a universal serial bus (USB) interface shown in FIG. 1, and FIG. 3B illustrates an interface of a plug shown in FIG. 2;

DETAILED DESCRIPTION

Figure 1:
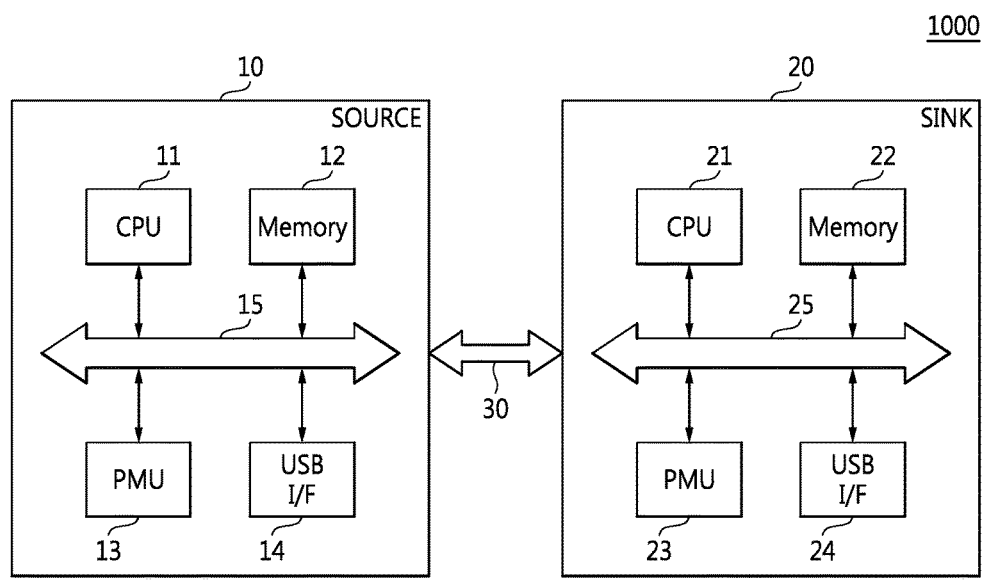
FIG. 1 is a schematic block diagram of a data processing system according to an example embodiment of the present inventive concepts.

Example embodiments of the inventive concept will be described more fully hereinafter with reference to the accompanying drawings. In the drawings, the size and relative sizes of layers and regions may be exaggerated for clarity. Like reference numerals may refer to like elements throughout the accompanying drawings.

It will be understood that when an element is referred to as being "connected" or "coupled" to another element, it can be directly connected or coupled to the other element or intervening elements may be present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

Herein, when two or more elements or values are described as being substantially the same as or equal to each other, it is to be understood that the elements or values are identical to each other, indistinguishable from each other, or distinguishable from each other but functionally the same as each other as would be understood by a person having ordinary skill in the art.

FIG. 1 is a schematic block diagram of a data processing system 1000 according to an example embodiment of the present inventive concepts. Referring to FIG. 1, a data processing system 1000 includes a source 10, a sink 20, and a cable assembly 30. The source 10 may be connected to the sink 20 through the cable assembly 30, and may communicate using the same data transmission protocol.

The source 10 which can be referred to as a downstream facing port (DFP) may be embodied as a personal computer (PC) or a mobile computing device. The mobile computing device may be embodied as a laptop computer, a smart phone, a tablet PC, a personal digital assistant (PDA), an enterprise digital assistant (EDA), a digital still camera, a digital video camera, a portable multimedia player (PMP), a mobile internet device (MID), a wearable computer, an internet of things (IoT) device, or an internet of everything (IoE) device.

The source 10 may include a central processing unit (CPU) 11, a memory 12, a power management unit (PMU) 13, a universal serial bus (USB) interface 14, and a system bus 15. According to an example embodiment, the source 10 may further include elements other than elements shown in FIG. 1.

The CPU 11 may control an overall operation of the source 10 and transmit or receive signals to or from the memory 12, the PMU 13, and the USB interface 14 through the system bus 15, and the memory 12 may store data and parameters for performing an operation of the source 10.

The PMU 13 may control a power supplied from the outside or a power used inside the source 10. The USB interface 14 may be connected to the cable assembly 30, and interface with the sink 20 through the cable assembly 30 including a power supply terminal and a data communication terminal.

The sink 20 which can be referred to as a upstream facing port (UFP) may be embodied as a smart phone, a tablet PC, a portable USB charger, a portable USB hand-warmer, a portable USB fan, a portable USB MP3, a PDA, a navigation, a USB hub, a USB external hard disk, and the like. The sink 20 may include a CPU 21, a memory 22, a PMU 23, a USB interface 24, and a system bus 25.

The CPU 21 may control an overall operation of the sink 20 and transmit or receive signals to or from the memory 22, the PMU 23, and the USB interface 24 through the system bus 25, and the memory 22 may store data and parameters for performing an operation of the sink 20.

The PMU 23 may control a power supplied from the outside or a power used inside the sink 20. The USB interface 24 is connected to the cable assembly 30, and may interface with the source 10 through the cable assembly 30 including a power supply terminal and a data communication terminal. The cable assembly 30 may be a USB full-featured type-C standard cable assembly described in a USB type-C cable and a connector v1.0 specification.

The present specification describes the USB type-C cable and the connector v1.0 specification as reference, and the cable assembly 30 is a cable assembly of a USB type-C to which a USB 3.1 protocol is applied.

Figure 2:
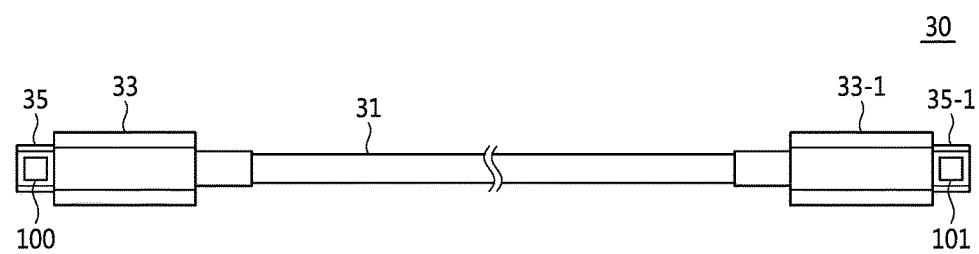
FIG. 2 illustrates a cable assembly according to an example embodiment of the present inventive concepts.

FIG. 2 illustrates a cable assembly according to an example embodiment of the present inventive concepts. Referring to FIGS. 1 and 2, the cable assembly 30 includes a cable 31, an overmold 33 or 33-1, and a plug 35 or 35-1.

The cable assembly 30 may control or relay data communication according to the USB 3.1 protocol between the source 10 and the sink 20 through the cable 31 by connecting, for example, the source 10 and a first plug 35, and connecting the sink and a second plug 35-1.

The first plug 35 may be connected to the cable 31 through a first overmold 33, and the second plug 35-1 may be connected to the cable 31 through a second overmold 33-1. The first plug 35 may include a first integrated circuit 100 inside the first plug 35, and the second plug 35-1 may include a second integrated circuit 101 inside the second plug 35-1.

In the present specification, the integrated circuit 100 or 101 may include an electronic marked integrated circuit (EMIC) which stores cable information of a cable 20 in an electronic mark. The cable information may include vendor information, a hardware version, a software version, communication protocol information, characteristics information (e.g., length, material quality, an amount of transmission, and the like) of a cable, and latency.

FIG. 3A illustrates a USB interface shown in FIG. 1, and FIG. 3B illustrates an interface of a plug shown in FIG. 2. Referring to FIGS. 1 to 3A, the USB interface 14 or 24 which can be connected to the plug 35 or 35-1 may include 24 pins A1 to A12 and B1 to B12. In detail, the USB interface 14 or 24 may include first GND pins A1, A12, B1, and B12, first USB 3.1 transmitter pins A2, A3, B2, and B3, first USB 3.1 receiver pins A10, A11, B10, and B11, first VBUS pins A4, A9, B4, and B9, first CC pins A5 and B5, first USB 2.0 signal pins A6, A7, B6, and B7, and first side pins A8 and B8.

Referring to FIGS. 1 to 3B, the plug 35 or 35-1 may include 24 pins A1 to A12 and B1 to B12 corresponding to respective pins of the USB interface 14 or 24. In detail, a plug 40 or 41 may include second GND pins A1, A12, B1, and B12, second USB 3.1 transmitter pins A2, A3, B2, and B3, second USB 3.1 receiver pins A10, A11, B10, and B11, second VBUS pins A4, A9, B4, and B9, a second CC pin A5, a VCONN pin B5, second USB 2.0 signal pins A6 and A7, and second side pins A8 and B8.

The first USB 3.1 transmitter pins A2, A3, B2, and B3 of the USB interface 14 or 24 may be connected to the first USB 3.1 transmitter pins A2, A3, B2, and B3 of the plug 35 or 35-1, and the first USB 3.1 receiver pins A10, A11, B10, and B11 of the USB interface 14 or 24 may be connected to the second USB 3.1 transmitter pins A2, A3, B2, and B3 of the plug 35 or 35-1, and thereby transmitting or receiving data between the USB interface 14 or 24 and the plug 35 or 35-1 according to the USB 3.1 protocol.

Each of the first CC pins A5 and B5 of the USB interface 14 or 24 may be connected to the second CC pin A5 or the VCONN pin B5 of the plug 35 or 35-1.

Figure 4:
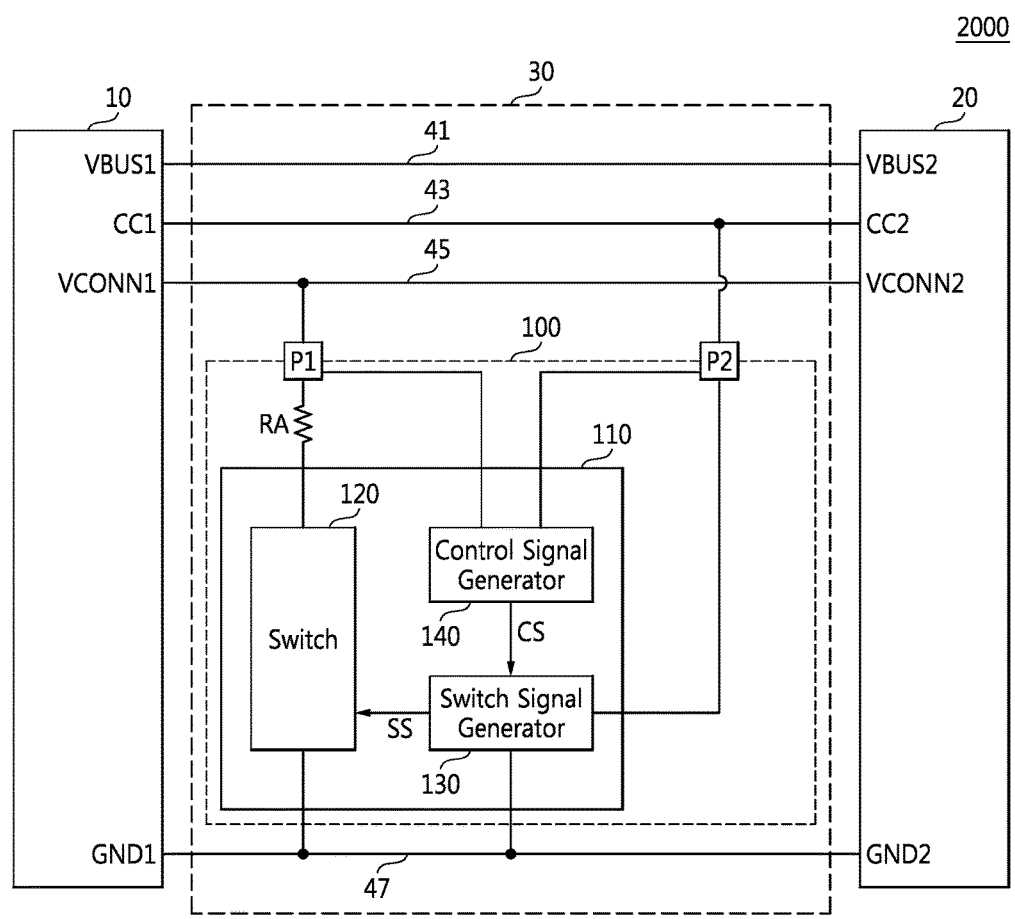
FIG. 4 is a schematic block diagram of a data processing system which includes an integrated circuit shown in FIG. 2 according to an example embodiment of the present inventive concepts.

FIG. 4 is a schematic block diagram of a data processing system 2000 which includes the integrated circuit shown in FIG. 2 according to an example embodiment of the present inventive concepts. Referring to FIGS. 1 to 4, a data processing system 2000 may include a source 10, a sink 20, and a cable assembly 30.

The cable assembly 30 may include a power transmission line 41, a configuration channel (CC) line 43, an operation voltage transmission line 45, a ground line 47, and an integrated circuit 100.

The power transmission line 41 may be connected between a first VBUS terminal VBUS1 of the source 10 and a second VBUS terminal VBUS 2 of the sink 20, and supply a power to the sink 20 from the source 10.

The first VBUS terminal VBUS1 may be one of first VBUS pins A4, A9, B4, and B9 of the first USB interface 14, and the second VBUS terminal VBUS2 may be one of first VBUS pins A4, A9, B4, and B9 of the second USB interface 24.

The CC line 43 may be connected between a first CC terminal CC1 of the source 10 and a second CC terminal CC2 of the sink 20, and discover, configure, and/or manage a connection between the source 10 and the sink 20 through the cable assembly 30.

The first CC terminal CC1 may be one of first CC pins A5 and B5 of the first USB interface 14, and the second CC terminal CC2 may be one of first pins A5 and B5 of the second USB interface 24.

The source 10 and the sink 20 may transmit or receive cable information stored in the integrated circuit 100 or 101 through a one-line communication using the CC line 43, and transmit or receive USB accessory information.

The operation voltage transmission line 45 may be connected between a first VCONN terminal VCONN1 of the source 10 and a second VCONN terminal VCONN2 of the sink 20, and supply an operation voltage for the integrated circuit 100 from the source 10 or the sink 20 to the integrated circuit 100. The operation voltage may be a voltage for reading cable information stored in an electronic mark from the integrated circuit 100 or 101 to the cable 31.

The first VCONN terminal VCONN1 may be one of the first CC pins A5 and B5 of the first USB interface 14, and the second VBUS terminal VBUS2 may be one of the first CC pins A5 and B5 of the second USB interface 24. The ground line 47 may be connected between a first ground terminal GND1 of a source 10 and a second ground terminal GND2 of a sink 20. The first ground terminal GND1 may be first GND pins A1, A12, B1, and B12 of the first USB interface 14, and the second ground terminal GND2 may be second GND pins A1, A12, B1, and B12 of the second USB interface 24.

The integrated circuit 100 which can be embedded in the plug 35 or 35-1 of the cable assembly 30 may include a first pin P1, a second pin P2, a first resistor RA, a ground line 47, and a switching circuit 110.

The first pin P1 may be connected to the operation voltage transmission line 45, and the second pin P2 may be connected to the CC line 43. The first pin P1 may receive a first voltage through the operation voltage transmission line 45, and the second pin P2 may receive a second voltage through the CC line 43.

The first resistor RA may be connected between the first pin P1 and the switch 120 included in the switching circuit 110. The integrated circuit 100 includes the first resistor RA, and thereby a difference between a first voltage supplied to the first pin P1 and a second voltage supplied to the second pin P2 occurs, and the CC line 43 and the operation voltage transmission line 45 may be distinguished from each other through the difference in voltage.

The switching circuit 110 may connect the first resistor RA and the ground line 47 based on the second voltage supplied to the second pin P2, and may disconnect the first resistor RA from the ground line 47 based on the first voltage supplied to the first pin P1.

The switching circuit 110 may include a switch 120, a control signal generator 140, and a switch signal generator 130. The switch 120 may be connected between the first resistor RA and the ground line 47, and may control whether to connect the first resistor RA and the ground line 47 in response to switch signals SS output from the switch signal generator 130.

The control signal generator 140 may be connected to each of the first pin P1, the second pin P2, and the switch signal generator 130, and may generate control signals CS for controlling an operation of the switch signal generator 130.

The switch signal generator 130 may be connected between a control terminal of the switch 120 and the second pin P2, and may generate the switch signals SS for controlling an operation of the switch 120 in response to the control signals CS output from the control signal generator 140.

The control signal generator 140 may generate a first control signal when the second voltage is supplied to the second pin P2, and the switch signal generator 130 may generate a first switch signal which turns on the switch 120 in response to the first control signal. At this time, the first resistor RA and the ground line 47 may be connected to each other in response to the first switch signal. For example, the control signals CS may include the first control signal and the switch signals SS may include the first switch signal.

The control signal generator 140 may generate a second control signal based on the first voltage supplied to the first pin P1, and the switch signal generator 130 may generate a second switch signal which turns off the switch 120 in response to the second control signal. At this time, the first resistor RA and the ground line 47 may be disconnected from each other in response to the second switch signal. For example, the control signals CS may include the second control signal and the switch signals SS may include the second switch signal.

The second control signal may be generated in response to a power stabilization signal indicating that an operation voltage for the integrated circuit 100 is stabilized.

The integrated circuit 100 connects the first resistor RA and the ground line 47 based on the second voltage supplied to the second pin P2, thereby distinguishing the CC line 43 from the operation voltage transmission line 45 even when an operation voltage for the integrated circuit 100 is not supplied to the integrated circuit 100.

The integrated circuit 100 disconnects the first resistor RA from the ground line 47 when the operation voltage for the integrated circuit 100 is stabilized, thereby reducing power consumption by preventing unnecessary current flow through the first resistor RA.

Figure 5:
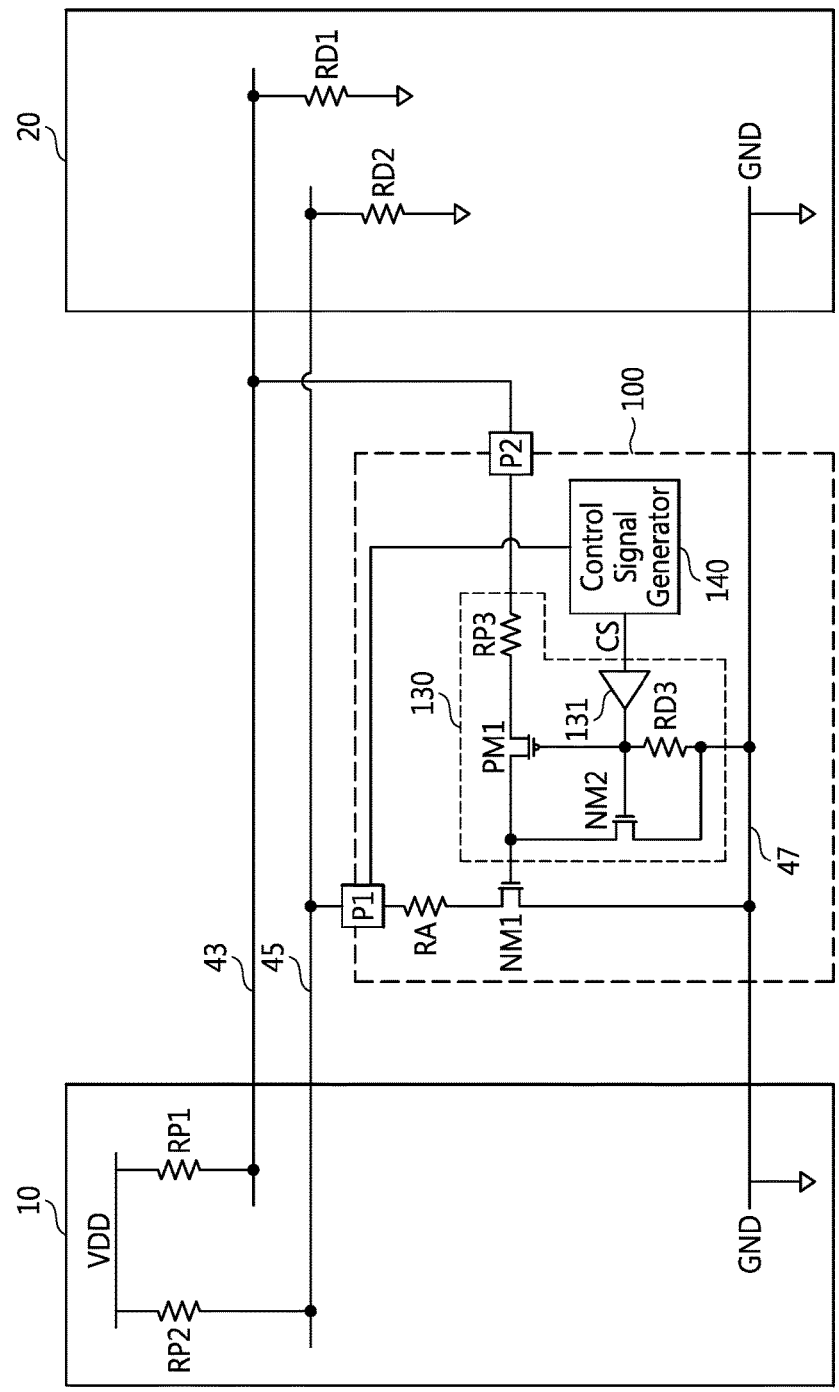
FIG. 5 illustrates an example embodiment of the integrated circuit shown in FIG. 4.

FIG. 5 illustrates an example embodiment of the integrated circuit shown in FIG. 4. Referring to FIGS. 4 and 5, the source 10 may include a first pull-up resistor RP1 connected between a first node supplying an operation voltage VDD and the CC line 43 and a second pull-up resistor RP2 connected between the first node and the operation voltage transmission line 45.

The sink 20 may include a first pull-down resistor RD1 connected between the ground node connected to the ground line 47 and the CC line 43 and a second pull-down resistor RD2 connected between the ground node and the operation voltage transmission line 45. The integrated circuit 100 may include a first pin P1, a second pin P2, a first resistor RA, a ground line 47, a first NMOS transistor NM1, a switch signal generator 130, and a control signal generator 140.

The switch 120 of FIG. 4 may be embodied as the first NMOS transistor NM1 of FIG. 5, and the switch signal generator 130 may include a plurality of resistors RP3 and RD3, a plurality of transistors NM2 and PM1, and a buffer 131.

A gate of a PMOS transistor PM1 is connected to a third pull-down resistor RD3, and the third pull-down resistor RD3 is connected to the ground line 47, such that a first signal having a low level (or ground) may be supplied to the gate of the PMOS transistor PM1 through the ground line 47. The PMOS transistor PM1 may be turned on by the third pull-down resistor RD3 connected to the ground line 47 even when a power is not supplied from the outside (or external source). At this time, when a power is not supplied from the outside, the control signal generator 140 does not operate.

When the PMOS transistor PM1 is turned on and a second voltage is supplied to the second pin P2, the second voltage may be applied to a gate of a first NMOS transistor NM1. When the second voltage is supplied to the gate of the first NMOS transistor NM1, the first NMOS transistor NM1 is turned on and the first resistor RA may be connected to the ground line 47.

The control signal generator 140 may transmit a second signal having a high level to the buffer 131 as a control signal based on the first voltage (that is, the power supplied from the outside) supplied to the first pin P1.

The second signal may be output to a gate of the PMOS transistor PM1 and a gate of a second NMOS transistor NM2 through the buffer 131, and the PMOS transistor PM1 may be turned off and the second NMOS transistor NM2 may be turned on in response to the second signal.

When the PMOS transistor PM1 is turned off and the second NMOS transistor NM2 is turned on, the gate of the first NMOS transistor NM1 may be connected to the ground line 47 through pull-down resistor RD3, and the first NMOS transistor NM1 may be turned off.

Figure 6:
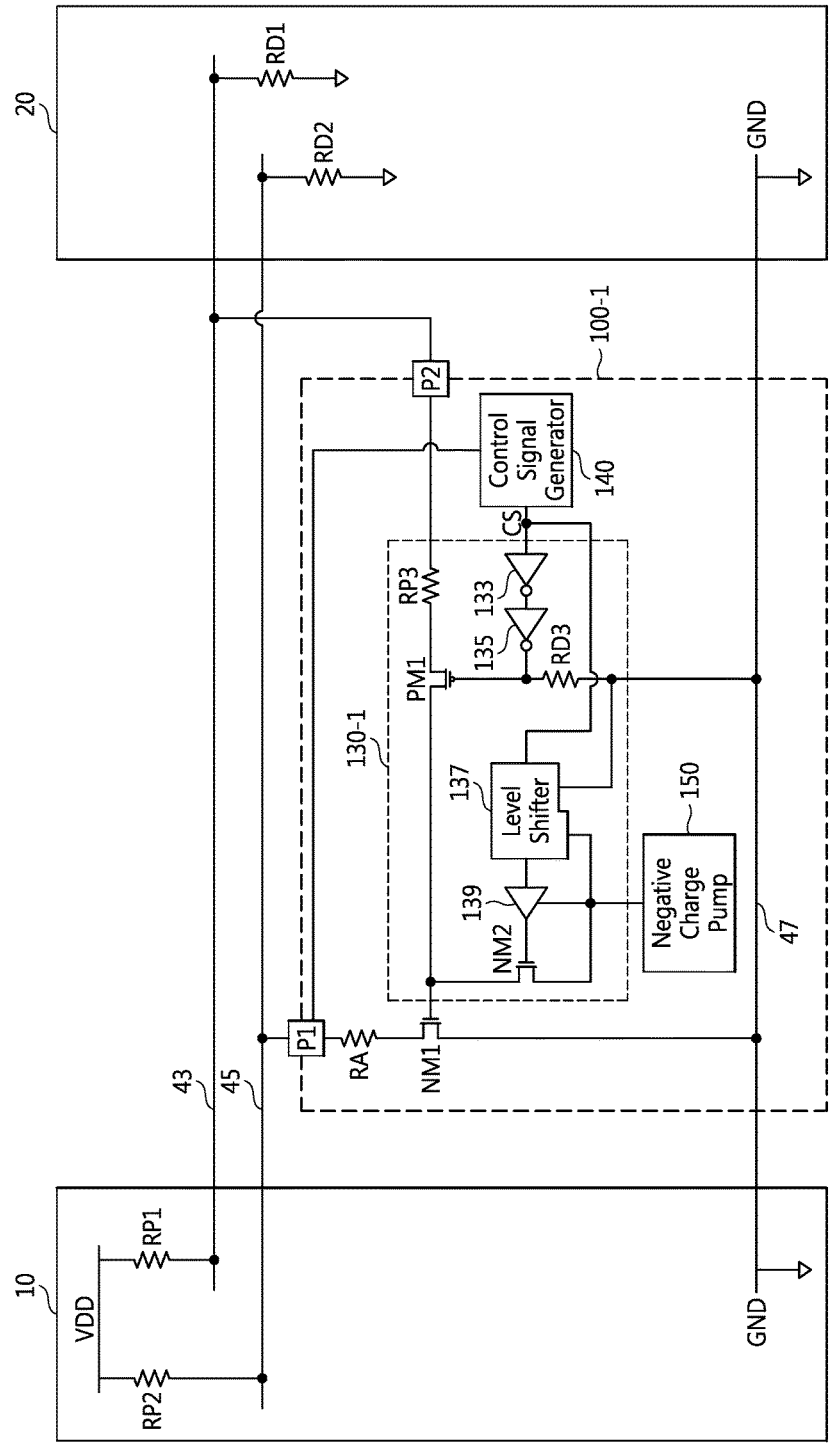
FIG. 6 illustrates another example embodiment of the integrated circuit shown in FIG. 4.

FIG. 6 illustrates an example embodiment of the integrated circuit shown in FIG. 4. Referring to FIGS. 1 to 6, the integrated circuit 100 of FIG. 5 may be replaced with an integrated circuit 100-1 of FIG. 6.

The integrated circuit 100-1 may include a first pin P1, a second pin P2, a first resistor RA, a ground line 47, a first NMOS transistor NM1, a switch signal generator 130-1, a control signal generator 140, and a negative charge pump 150.

The switch 120 of FIG. 4 may be embodied as the first NMOS transistor NM1 of FIG. 6, and the switch signal generator 130-1 may include a plurality of resistor RP3 and RD3, a plurality of transistors NM2 and PM1, a plurality of inverters 133 and 135, a level shifter 137, and a buffer 139. The resistor RP3 is connected between the PMOS transistor PM1 and the second pin P2.

A gate of the PMOS transistor PM1 is connected to a third pull-down resistor RD3, and the third pull-down resistor RD3 is connected to the ground line 47, such that a first signal having a low level may be supplied to the gate of the PMOS transistor PM1 through the ground line 47. The PMOS transistor PM1 may be turned on even when a power is not supplied from the outside due to the third pull-down resistor RD3 connected to the ground line 47. When the power is not supplied from the outside, the control signal generator 140 and the negative charge pump 150 do not operate.

When the PMOS transistor PM1 is turned on and a second voltage is supplied to the second pin P2, the second voltage may be applied to a gate of the first NMOS transistor NM1 through the resistor RP3 and the PMOS transistor PM1. When the second voltage is supplied to the gate of the first NMOS transistor NM1, the first NMOS transistor NM1 may be turned on and the first resistor RA may be connected to the ground line 47.

The control signal generator 140 may transmit a second signal having a high level to a first inverter 133 as a control signal CS based on the first voltage (that is, the power supplied from the outside) supplied to the first pin P1. The second signal may be output as a third signal having a high level through the first inverter 133 and a second inverter 135, and the PMOS transistor PM1 may be turned off in response to the third signal.

The level shifter 137 may receive a second signal having a high level from the control signal generator 140, and may be connected to the negative charge pump 150, the buffer 139, and the ground line 47.

When a power is supplied to the integrated circuit 100-1, the negative charge pump 150 may supply a negative voltage to the gate of the first NMOS transistor NM1 through the second NMOS transistor NM2. When the PMOS transistor PM1 is turned off and the second NMOS transistor NM2 is turned on, the negative voltage may be supplied to the gate of the first NMOS transistor NM1 and the first NMOS transistor NM1 may be turned off.

Figure 7:
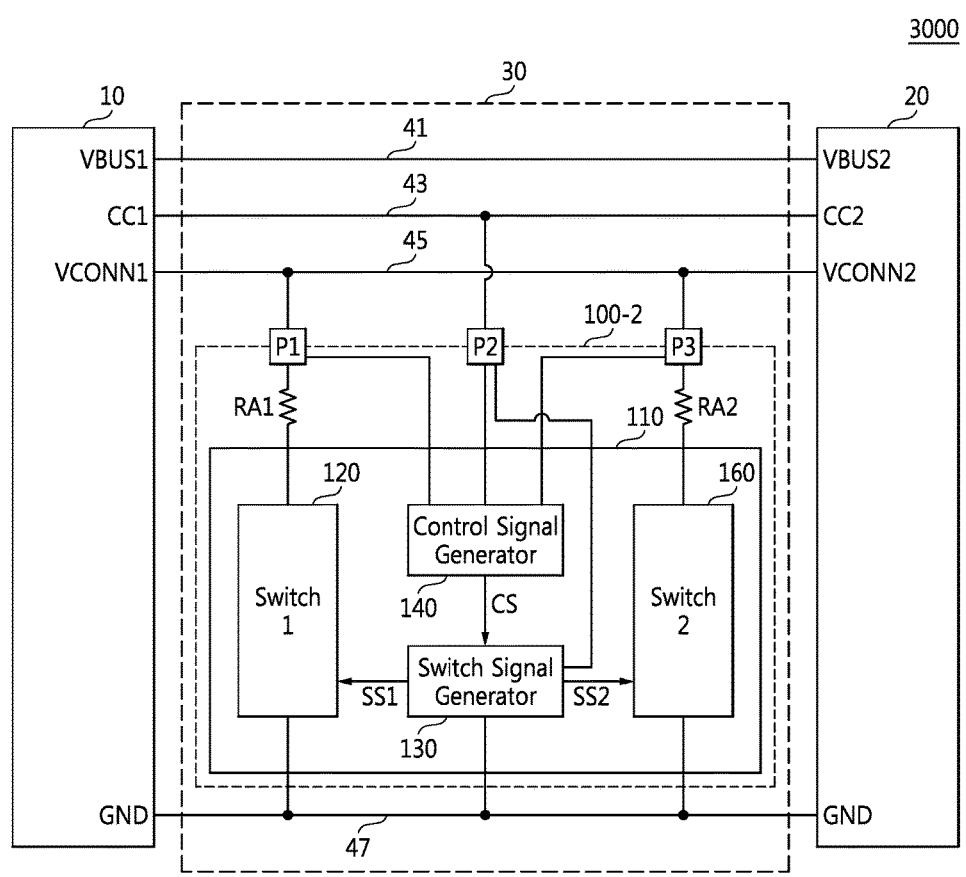
FIG. 7 is a schematic block diagram of a data processing system which includes the integrated circuit shown in FIG. 2 according to another example embodiment of the present inventive concepts.

FIG. 7 is a schematic block diagram of a data processing system 3000 which includes the integrated circuit shown in FIG. 2 according to an example embodiment of the present inventive concepts. Referring to FIGS. 1 to 7, a data processing system 3000 may include a source 10, a sink 20, and a cable assembly 30.

The data processing system 3000 is substantially the same as or similar to the data processing system 2000 of FIG. 4 except for a difference in configuration of an integrated circuit 100-2 included in the cable assembly 30.

The integrated circuit 100-2 may include a first pin P1, a second pin P2, a third pin P3, a first resistor RA1, a second resistor RA2, a ground line 47, and a switching circuit 110.

Each of the first pin P1 and the third pin P3 may be connected to the operation voltage transmission line 45, and the second pin P2 may be connected to the CC line 43. Each of the first pin P1 and the third pin P3 may be provided with a first voltage through the operation voltage transmission line 45, and the second pin P2 may be provided with a second voltage through the CC line 43.

The first resistor RA1 may be connected between the first pin P1 and a first switch 120 included in a switching circuit 110-1. The integrated circuit 100-2 includes the first resistor RA1, and thereby a difference between the first voltage supplied to the first pin P1 and the second voltage supplied to the second pin P2 may occur and the CC line 43 may be distinguished from the operation voltage transmission line 45 due to the difference in voltage.

The second resistor RA2 may be connected between the third pin P3 and a second switch 160 included in the switching circuit 110-1. The integrated circuit 100-1 includes the second resistor RA2, and thereby a difference between the first voltage supplied to the third pin P3 and the second voltage supplied to the second pin P2 may occur and the CC line 43 may be distinguished from the operation voltage transmission line 45 due to the difference in voltage.

According to some example embodiments, the switching circuit 110 may connect the first resistor RA1 and the ground line 47 based on the second voltage supplied to the second pin P2, and may disconnect the first resistor RA1 from the ground line 47 based on the first voltage supplied to the first pin P1.

According to some example embodiments, the switching circuit 110 may connect the second resistor RA2 and the ground line 47 based on the second voltage supplied to the second pin P2, and may disconnect the second resistor RA2 from the ground line 47 based on the first voltage supplied to the third pin P3.

The switching circuit 110 may include a first switch 120, a switch signal generator 130, a control signal generator 140 and a second switch 160.

The first switch 120 may be connected between the first resistor RA1 and the ground line 47, and may control whether to connect the first resistor RA1 and the ground line 47 in response to first switch signals SS1 output from the switch signal generator 130.

The second switch 160 may be connected between the second resistor RA2 and the ground line 47, and may control whether to connect the second resistor RA2 and the ground line 47 in response to second switch signals SS2 output from the switch signal generator 130.

The control signal generator 140 may be connected to each of the first pin P1, the second pin P2, the third pin P3, and the switch signal generator 130, and may generate control signals CS for controlling an operation of the switch signal generator 130.

The switch signal generator 130 may be connected to each of a control terminal of the first switch 120, a control terminal of the second switch 160, and the second pin P2, and may generate the first switch signals SS1 for controlling an operation of the first switch 120 and the second switch signals SS2 for controlling an operation of the second switch 160 in response to the control signals CS output from the control signal generator 140.

The control signal generator 140 may generate a first control signal when a second voltage is supplied to the second pin P2, and the switch signal generator 130 may generate a first switch signal which turns on the first switch 120 in response to the first control signal. At this time, the first resistor RA1 and the ground line 47 may be connected to each other in response to the first switch signal. For example, the control signals CS may include the first control signal and the first switch signals SS1 may include the first switch signal.

The control signal generator 140 may generate a second control signal based on the first voltage supplied to the first pin P1, and the switch signal generator 130 may generate a second switch signal which turns off the first switch 120 in response to the second control signal. At this time, the first resistor RA1 and the ground line 47 may be disconnected from each other in response to the second switch signal. For example, the control signals CS may include the second control signal and the first switch signals SS1 may include the second switch signal.

The second control signal may be generated in response to a power stabilization signal which indicates that an operation voltage for the integrated circuit 100-2 is stabilized.

The control signal generator 140 may generate a third control signal when the second voltage is supplied to the second pin P2, and the switch signal generator 130 may generate a third switch signal which turns on the second switch 160 in response to the third control signal. At this time, the second resistor RA2 and the ground line 47 may be connected to each other in response to the third switch signal. For example, the control signals CS may include the third control signal and the second switch signals SS2 may include the third switch signal.

The control signal generator 140 may generate a fourth control signal based on the first voltage supplied to the third pin P3, and the switch signal generator 130 may generate a fourth switch signal which turns off the second switch 160 in response to the fourth control signal. At this time, the second resistor RA2 and the ground line 47 may be disconnected from each other in response to the fourth switch signal. For example, the control signals CS may include the fourth control signal and the second switch signals SS2 may include the fourth switch signal.

The fourth control signal may be generated in response to a power stabilization signal which indicates that an operation voltage for the integrate circuit 100-2 is stabilized.

The integrated circuit 100-2 may connect the first resistor RA1 and the ground line 47 or connect the second resistor RA2 and the ground line 47 based on the second voltage supplied to the second pin P2, thereby distinguishing the CC line 43 from the operation voltage transmission line 45 even when an operation voltage for the integrated circuit 100-2 is not supplied.

The integrated circuit 100-2 may disconnect the first resistor RA1 form the ground line 47 or disconnect the second resistor RA2 form the ground line 47 when an operation voltage for the integrated circuit 100-2 is stabilized, thereby reducing power consumption of the integrated circuit 100-2 by preventing an unnecessary current flow through the first resistor RA1 or the second resistor RA2.

Figure 8:
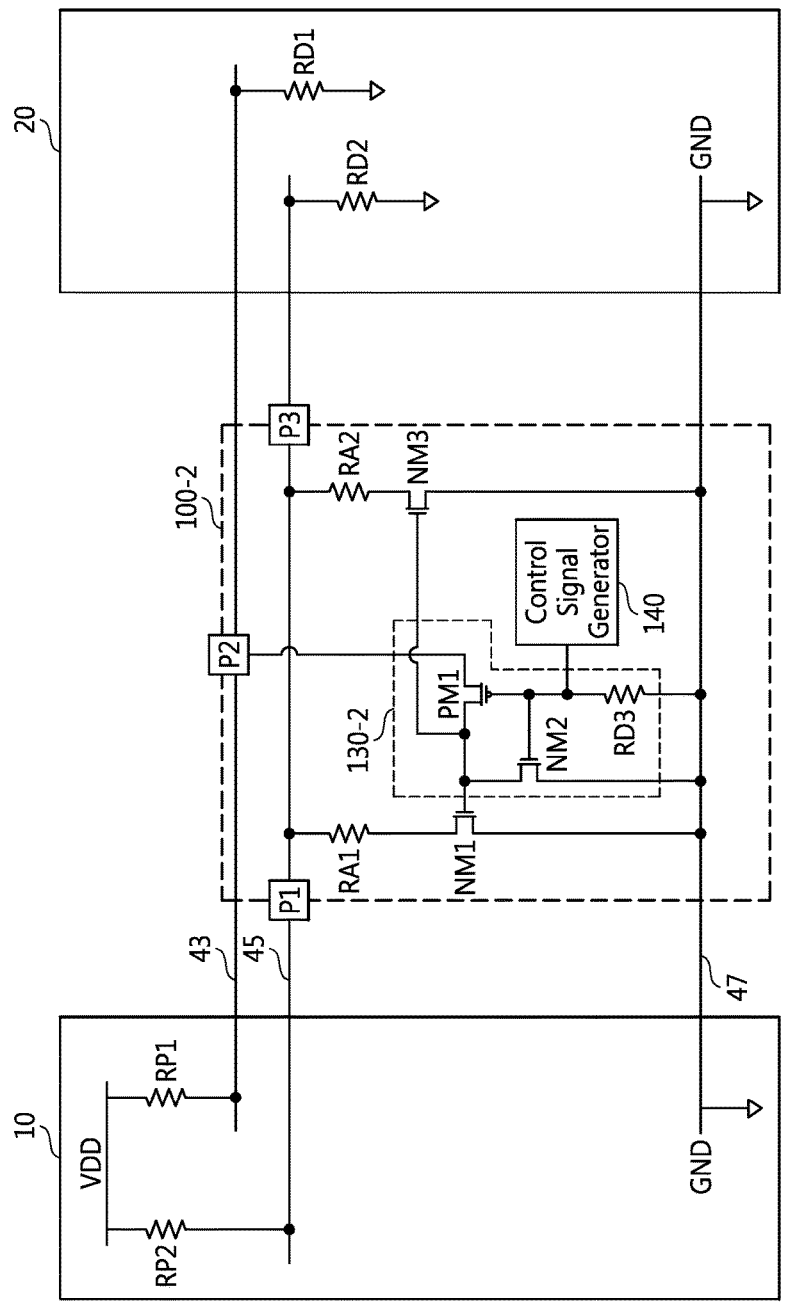
FIG. 8 illustrates an example embodiment of the integrated circuit shown in FIG. 7.

FIG. 8 illustrates an example embodiment of the integrated circuit shown in FIG. 7. Referring to FIGS. 1 to 8, the integrated circuit 100-2 may include a first pin P1, a second pin P2, a third pin P3, a first resistor RA1, a second resistor RA2, a ground line 47, a first NMOS transistor NM1, a switch signal generator 130-2, and a control signal generator 140.

The first switch 120 of FIG. 7 may be embodied as the first NMOS transistor NM1 of FIG. 8, the second switch 160 of FIG. 7 may be embodied as a third NMOS transistor NM3 of FIG. 8, and the switch signal generator 130-2 may include a third pull-down resistor RD3 and a plurality of transistors MM2 and PM1.

A gate of a PMOS transistor PM1 is connected to the third pull-down resistor RD3, and the third pull-down resistor RD3 is connected to the ground line 47, such that a first signal having a low level may be supplied to the gate of the PMOS transistor PM1 through the ground line 47. The PMOS transistor PM1 may be turned on by the third pull-down resistor RD3 connected to the ground line 47 even when a power is not supplied from the outside. At this time, when the power is not supplied from the outside, the control signal generator 140 does not operate.

According to some example embodiments, when the PMOS transistor PM1 is turned on and a second voltage is supplied to the second pin P2, the second voltage may be applied to a gate of the first NMOS transistor NM1 through the PMOS transistor PM1. When the second voltage is applied to the gate of the first NMOS transistor NM1, the first NMOS transistor NM1 is turned on and the first resistor RA1 may be connected to the ground line 47.

The control signal generator 140 may output a second signal having a high level based on the first voltage (that is, a power supplied from the outside) supplied to the first pin P1, and the PMOS transistor PM1 may be turned off and the second NMOS transistor NM2 may be turned on in response to the second signal.

When the PMOS transistor PM1 is turned off and the second NMOS transistor NM2 is turned on, the gate of the first NMOS transistor NM1 may be connected to the ground line 47, and the first NMOS transistor NM1 may be turned off.

According to some example embodiments, when the PMOS transistor PM1 is turned on and a second voltage is supplied to the second pin P2, the second voltage may be supplied to a gate of a third NMOS transistor NM3. When the second voltage is supplied to the gate of the third NMOS transistor NM3, the third NMOS transistor NM3 may be turned on and the second resistor RA2 may be connected to the ground line 47.

The control signal generator 140 may output a second signal having a high level based on a first voltage (that is, a power supplied from the outside) supplied to the third pin P3, the PMOS transistor PM1 may be turned off and the second NMOS transistor NM2 may be turned on in response to the second signal. When the PMOS transistor PM1 is turned off and the second NMOS transistor NM2 is turned on, the gate of the third NMOS transistor NM3 may be connected to the ground line 47 and the third NMOS transistor NM3 may be turned off.

Figure 9:
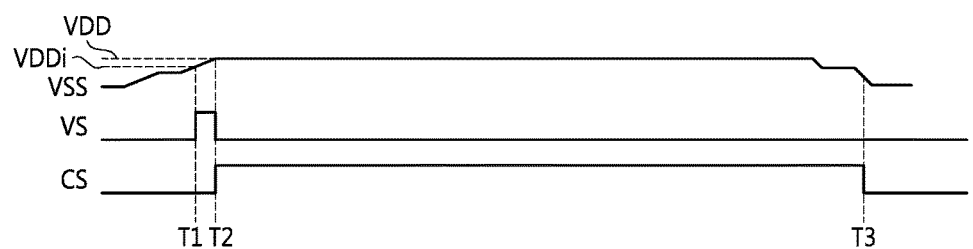
FIG. 9 is a timing diagram which describes an operation in which the integrated circuit generates a control signal in response to a power stabilization signal.

FIG. 9 is a timing diagram which describes an operation in which the integrated circuit generates a control signal in response to a power stabilization signal.

Referring to FIGS. 1 to 9, the control signal generator 140 may generate a power stabilization signal VS having a high level when determining that an operation voltage VDDi supplied to the integrated circuit 100, 100-1, or 100-2 is stabilized at a first time T1. At this time, the operation voltage VDDi may be transmitted to the control signal generator 140 from the first pin P1 or the third pin P3 through the operation voltage transmission line 45.

At a second time T2, the control signal generator 140 may generate a control signal CS having a high level in response to a power stabilization signal VS having a high level. At this time, the control signal CS is used to generate a switch signal SS, SS1 or SS2 which turns off the switch 120 or 160, and may be transmitted to the switch signal generator 130 from the control signal generator 140. At a third time T3, the control signal generator 140 may cause the control signal CS having a high level to transit to a low level when determining that an operation voltage VDDi supplied to the integrated circuit 100, 100-1, or 100-2 is not stabilized.

Figure 10:
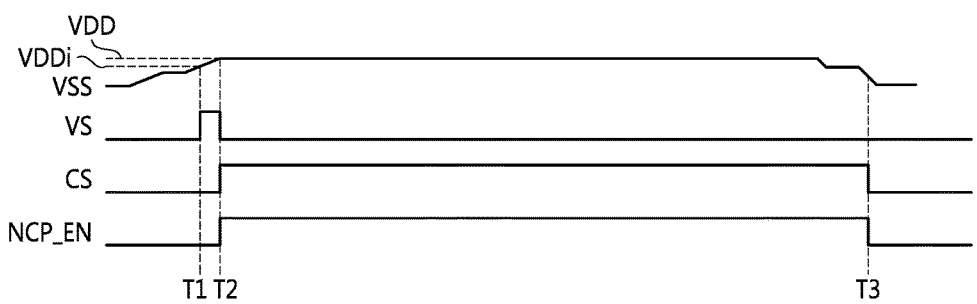
FIG. 10 is a timing diagram which describes an operation in which the integrated circuit generates a negative charge pump enable signal in response to a power stabilization signal.

FIG. 10 is a timing diagram which describes an operation in which the integrated circuit generates a negative charge pump enable signal in response to a power stabilization signal. Referring to FIGS. 1 to 10, at the first time T1, the control signal generator 140 may generate a power stabilization signal VS having a high level when determining an operation voltage VDDi supplied to the integrated circuit 100, 100-1, or 100-2 is stabilized. At this time, the operation voltage VDDi may be transmitted to the control signal generator 140 from the first pin P1 or the third pin P3 through the operation voltage transmission line 45.

At the second time T2, the control signal generator 140 may generate a control signal CS having a high level and a negative charge pump enable signal NCP_EN having a high level in response to the power stabilization signal VS having a high level.

The control signal CS is used to generate a switch signal SS, SS1 or SS2 which turns off the switch 120 or 160, and may be transmitted to the switch signal generator 130 from the control signal generator 140.

The negative charge pump enable signal NCP_EN is a signal for activating the negative charge pump 150 shown in FIG. 5 using the operation voltage VDDi, and the negative charge pump 150 may supply a negative voltage to the gate of the first NMOS transistor NM1 in response to the negative charge pump enable signal NCP_EN having a high level.

At the third time T3, the control signal generator 140 may cause a control signal CS having a high level and the negative charge pump enable signal NCP_EN having a high level to transit to a low level when determining an operation voltage VDDi supplied to the integrated circuit 100, 100-1, or 100-2 is not stabilized.

Figure 11:
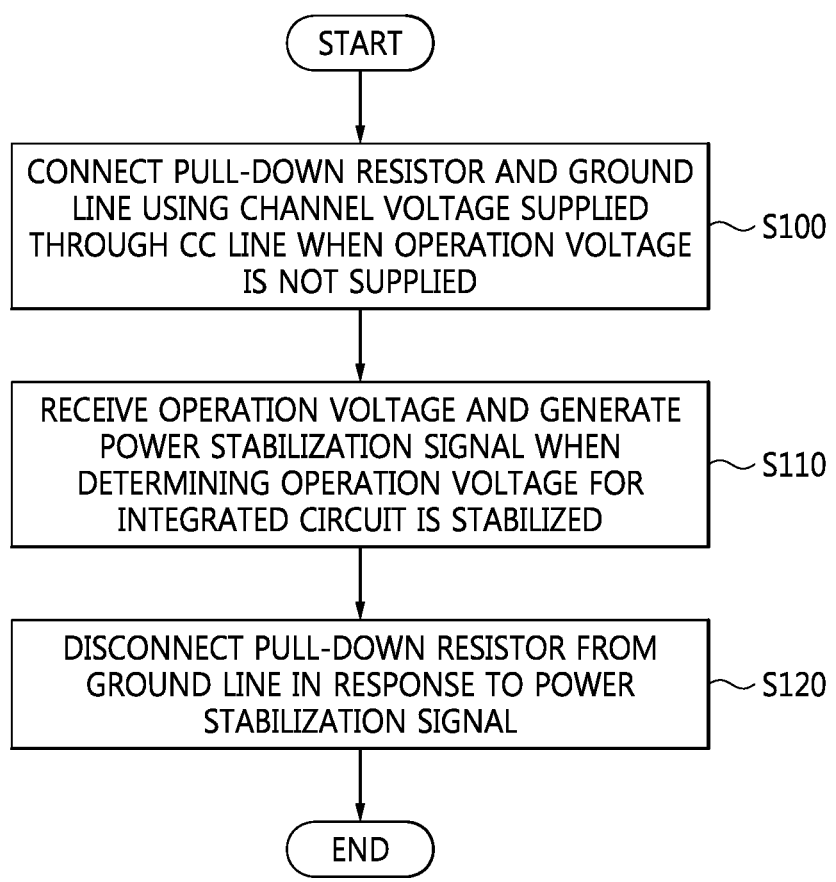
FIG. 11 is a flowchart which describes an operation method of an integrated circuit according to an example embodiment of the present inventive concepts.

FIG. 11 is a flowchart which describes an operation method of an integrated circuit according to an example embodiment of the present inventive concepts. Referring to FIGS. 1 to 11, the integrated circuit 100, 100-1, or 100-2 may connect a pull-down resistor RA, RA1, or RA2 connected to the operation voltage transmission line 45 with the ground line 47 using a channel voltage supplied through the CC line 43 when an operation voltage is not supplied through the operation voltage transmission line 45 in operation S100.

The integrated circuit 100, 100-1, or 100-2 may disconnect the pull-down resistor RA, RA1, or RA2 form the ground line 47 based on the operation voltage when the operation voltage is supplied through the operation voltage transmission line 45.

The integrated circuit 100, 100-1, or 100-2 may receive the operation voltage from the operation voltage transmission line 45, and generate a power stabilization signal VS when determining the operation voltage for the integrated circuit 100, 100-1, or 100-2 is stabilized in operation S110. The integrated circuit 100, 100-1, or 100-2 may disconnect the pull-down resistor RA, RA1, or RA2 from the ground line 47 in response to the power stabilization signal in operation S120.

An integrated circuit which can be embedded in a plug of a USB 3.1 type-C cable assembly according to an example embodiment of the present inventive concepts prevents an unnecessary current flow due to a pull-down resistor, which is connected to an operation voltage transmission line to distinguish the operation voltage transmission line from a configuration channel (CC) line, thereby reducing power consumption of the integrated circuit.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A device comprising:
   a first resistor connected to an operation voltage transmission line, and supplied with a first voltage via the operation voltage transmission line;
   a first transistor connected to the first resistor; and
   a negative charge pump coupled to the first transistor,
   wherein the first transistor is turned on and the first resistor is connected to a ground line when a second voltage is supplied to the first transistor via a configuration channel line,
   the negative charge pump is configured to supply a negative voltage to the first transistor when the negative charge pump is enabled, thereby reducing power consumption by preventing unnecessary current from flowing through the first resistor,
   the configuration channel line is distinguished from the operation voltage transmission line even when the first voltage is not supplied to the device, and
   the device is universal serial bus (USB) type-C compatible.

2. The device of claim 1, wherein the device is a cable.

3. The device of claim 1, wherein when the negative charge pump is disabled, the first transistor is turned on.

4. The device of claim 1, further comprising a switching circuit configured to connect the first resistor and the ground line.

5. The device of claim 1, wherein the negative charge pump is configured to supply the negative voltage to the first transistor when a power is supplied to the device.

6. The device of claim 1, wherein when the first voltage is stabilized, the first resistor is disconnected from the ground line.

7. The device of claim 1, further comprising:
   a first pin coupled to the first resistor and configured to receive the first voltage through the operation voltage transmission line; and
   a second pin configured to receive the second voltage through the configuration channel line.

8. A device comprising:
   a first resistor connected to an operation voltage transmission line, and supplied with a first voltage via the operation voltage transmission line;
   a first transistor connected to the first resistor; and
   a negative charge pump coupled to the first transistor,
   wherein the negative charge pump is configured to supply a negative voltage to the first transistor when a power is supplied to the device,
   when the first voltage is stabilized, the first resistor is disconnected from a ground line, thereby reducing power consumption by preventing unnecessary current from flowing through the first resistor, and
   the device is universal serial bus (USB) type-C compatible.

9. The device of claim 8, wherein the device is a cable.

10. The device of claim 8, wherein when the negative charge pump is disabled, the first transistor is turned on.

11. The device of claim 8, wherein the first transistor is turned on and the first resistor is connected to the ground line when a second voltage is supplied to the first transistor via a configuration channel line.

12. The device of claim 11, wherein the configuration channel line is distinguished from the operation voltage transmission line even when the first voltage is not supplied to the device.

13. The device of claim 8, wherein the negative charge pump is configured to supply the negative voltage to the first transistor when the negative charge pump is enabled.

14. The device of claim 8, further comprising a first pin coupled to the first resistor and configured to receive the first voltage through the operation voltage transmission line.

15. A cable assembly comprising:
a configuration channel line;
an operation voltage transmission line;
a ground line; and
an integrated device including:
    a first resistor connected to the operation voltage transmission line, and supplied with a first voltage via the operation voltage transmission line;
    a first transistor connected to the first resistor; and
    a negative charge pump coupled to the first transistor,
wherein the first transistor is turned on and the first resistor is connected to the ground line when a second voltage is supplied to the first transistor via the configuration channel line, the negative charge pump is configured to supply a negative voltage to the first transistor to turn off the first transistor, thereby reducing power consumption by preventing unnecessary current from flowing through the first resistor, and the integrated device is universal serial bus (USB) type-C compatible.

16. The cable assembly of claim 15, further comprising:
a first pin coupled to the first resistor and configured to receive the first voltage through the operation voltage transmission line; and
a second pin configured to receive the second voltage through the configuration channel line.

17. The cable assembly of claim 15, wherein the configuration channel line is distinguished from the operation voltage transmission line even when the first voltage is not supplied to the integrated device.

18. The cable assembly of claim 15, wherein when the first voltage is stabilized, the first resistor is disconnected from the ground line.

19. The cable assembly of claim 15, wherein when the negative charge pump is disabled, the first transistor is turned on.

20. The cable assembly of claim 15, wherein the integrated device includes a switching circuit configured to connect the first resistor and the ground line.

* * * * *